United States Patent
Pais et al.

(10) Patent No.: US 6,255,579 B1
(45) Date of Patent: Jul. 3, 2001

(54) METHOD AND APPARATUS FOR UTILIZING HEAT DISSIPATED FROM AN ELECTRICAL DEVICE

(75) Inventors: Martinho R. Pais, North Barrington; Petr Kacena, Chicago; Vinh Dinh Dino Trinh, Arlington Heights; John M. Smith, Elgin, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/547,178

(22) Filed: Apr. 11, 2000

Related U.S. Application Data

(62) Division of application No. 09/239,844, filed on Jan. 29, 1999, now Pat. No. 6,172,448.

(51) Int. Cl.[7] ................................................. H01L 35/34
(52) U.S. Cl. ........................ 136/201; 136/205; 136/223; 136/242; 313/46
(58) Field of Search ................................. 136/201, 205, 136/223, 242; 310/308; 313/46, 45, 33, 40

(56) References Cited

U.S. PATENT DOCUMENTS

| 5,117,268 | 5/1992 | Nishizawa et al. ..................... 357/22 |
| 5,777,427 | 7/1998 | Tanaka et al. ........................ 313/309 |
| 5,844,253 | 12/1998 | Kim et al. .............................. 257/24 |

OTHER PUBLICATIONS

Angrist, Stanley W., Chapter 6, Thermionic Generators, pp. 233–277, Direct Energy Conversion, Fouth Edition, (Book is part of Allyn and Bacon Series in Mechanical Engineering and Applied Mechanics) 1982.

*Primary Examiner*—Kathryn Gorgos
*Assistant Examiner*—Thomas H Parsons
(74) *Attorney, Agent, or Firm*—Kenneth A. Haas

(57) ABSTRACT

Embedded electronics (102) are operated under normal operating conditions, with power being supplied to embedded electronics via a power source (205). Heat is generated via the normal operation of the embedded electronics (102), and a voltage (117) is generated via thermionic emission from the heat. The voltage (117) that is generated is supplied to the power source (205) to help power the embedded electronics (102).

5 Claims, 3 Drawing Sheets

METHOD AND APPARATUS FOR UTILIZING HEAT DISSIPATED FROM AN ELECTRICAL DEVICE

The present application is a division U.S. application Ser. No. 09/239,844, filed on Jan. 29, 1999 now U.S. Pat. No. 6,172,448 issued Jan. 9, 2001, which is hereby incorporated by reference, and priority thereto for common subject matter is hereby claimed.

BACKGROUND OF THE INVENTION

1. Field of the Invention

The present invention relates generally to electrical components and, in particular, to utilization of heat dissipated from such electrical components.

2. Description of the Related Art

Much of the power supplied to certain electrical devices is radiated from the device as heat. Prior-art methods for eliminating unwanted heat from electrical devices entailed placing the electrical device on a heat sink to draw the heat away from the device. The heat sink then radiates the unwanted heat into the nearby environment.

U.S. Pat. No. 5,777,427, Electron Emission Cathode Having a Semiconductor Film; a Device Including the Cathode; and a Method for Making the Cathode by Tanaka et al., describes a method for eliminating heat from a semiconductor device by application of a voltage between an anode and the semiconductor device. The applied voltage serves to cool the semiconductor device by drawing electrons from the semiconductor device.

Whether by radiating unwanted heat into the environment, or cooling the device by application of a voltage to the device, much of the power supplied to the electrical device is wasted. In fact, cooling the electronic device by application of a voltage actually requires more power since in addition to powering the electronic device, power needs to be supplied to the voltage (cooling) source.

With the miniaturization and integration of power electronic devices, heat dissipation densities can be greater than 1000 Watts per square centimeter (W/cm$^2$). Thus for certain electrical devices, over 1000 Watts of power is wasted for every square centimeter area of heat dissipated from the device. Therefore a need exists for a method and apparatus for utilizing heat dissipated from an electrical device so that much of the power supplied to the device is not wasted during the process of heat dissipation.

DETAILED DESCRIPTION OF THE DRAWINGS

To address the need for heat dissipation from an electrical device, a method and apparatus for heat dissipation is provided herein. During operation embedded electronics are powered via a power source. Heat is generated via the normal operation of the embedded electronics, and a voltage is generated via thermionic emission from the heat. The voltage is then supplied to the power source to help power the embedded electronics.

A first embodiment of the present invention encompasses a method for utilizing heat dissipated from an electronic device. The method comprises the steps of operating an electronic device utilizing a power source with heat being generated from the operation of the electronic device. A voltage is produced from the heat generated from the operation of the electronic device and the voltage is applied to the power source to help operate the electronic device.

The present invention additionally encompasses a method for dissipating heat from an electronic device. The method comprises the steps of operating an electronic device utilizing a power source and generating heat from the operation of the electronic device. A voltage is produced from the heat generated from the operation of the electronic device, and that voltage is applied to the power source to help operate a second electronic device.

The present invention additionally encompasses an apparatus comprising a component part having embedded electronics existing on a first surface and a cathode existing on a second surface, spacers mounted to the cathode, an anode mounted to the spacers, an output to a power source that outputs a voltage generated between the anode and the cathode. In the preferred embodiment, the voltage is generated via a thermionic process. The apparatus finally comprises an input from the power source that powers the embedded electronics.

Figure 1:
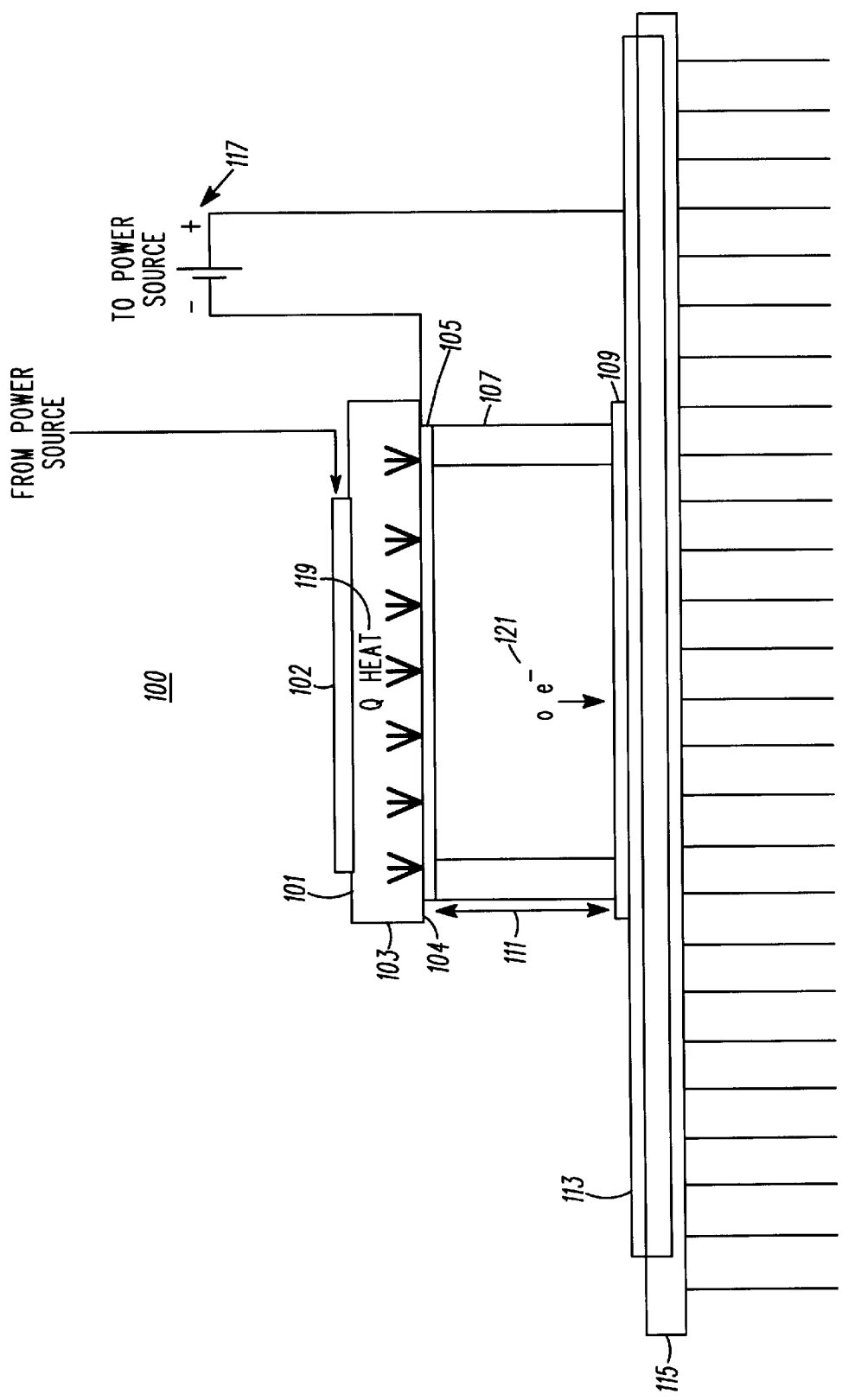
FIG. 1 is a block diagram of a heat dissipation device in accordance with the preferred embodiment of the present invention.

Turning now to the drawings, wherein like numerals designate like components, FIG. 1 is a block diagram of heat dissipation device 100 in accordance with the preferred embodiment of the present invention. In the preferred embodiment of the present invention heat dissipation device 100 is similar to devices described in U.S. Pat. No. 5,777,427, Electron Emission Cathode Having a Semiconductor Film; a Device Including the Cathode; and a Method for Making the Cathode by Tanaka et al., which is incorporated by reference herein. As shown, dissipation device 100 comprises heat-generating component part 103 having metalized cathode (emitter) 105 deposited on lower (second) surface 104 of component part 103. Component part 103 also includes embedded electronics 102 existing on an upper (first) surface 101. In the preferred embodiment of the present invention component part 103 is a modified MRF899 semiconductor device manufactured by Motorola, Inc. Although in the preferred embodiment of the present invention component part 103 is manufactured from Silicon Carbide (SiC), in alternate embodiments of the present invention, component part 103 may be manufactured from other compounds, such as, but not limited to diamond and gallium nitride (GaN).

As shown, component part 103 is mounted to metalized anode (collector) 109 utilizing spacers 107, and anode 109 is deposited onto substrate 113. Both the anode and the cathode are vapor deposited films of Tungsten (W) around 2 microns thick. However, in alternate embodiments of the present invention other compounds/elements may be utilized instead (e.g., Rhenium (Rh) or molybdenum (Mo)). In order to help cool electronic device 103, heat sink 115 is provided below substrate 113. Anode 109 is maintained a distance 111 of about several nanometers to several dozen micrometers from cathode 105. The space between anode 109 and cathode 105 is preferably a vacuum of $10^{-2}$ to $10^{-6}$ Torr. Unlike Tanake et al., the emission of electrons into the vacuum is not caused by an applied voltage between anode 109 and cathode 105, however, is caused by operating cathode 105 at a much higher temperature than anode 109. More specifically, because SiC is utilized by component part 103, the device can operate at temperatures exceeding 350C. This allows electrons to escape SiC/cathode 105 junction via thermionic emission without any voltage being applied to cathode 105. (Thermionic emission is described in detail in "Direct Energy Conversion" by Stanley W. Angrist, published by Carnegie-Mellon University, which is incorporated by reference herein).

As described in "Direct Energy Conversion," a thermionic energy converter consists of two electrode surfaces, one of which maintained at a high temperature. Electrons are given sufficient thermal energy to encourage them to escape from the surface of the emitter, collecting at the collector. Because of this, voltage 117 is generated between the high and low temperature surfaces. In the preferred embodiment of the present invention the voltage that is generated via the thermionic process is applied to a power supply (not shown) that helps power component part 103.

By utilizing thermionic conversion to help power the component part, much of the power supplied to the component is not wasted during the process of heat dissipation. In fact, up to 35% of the energy that is dissipated as heat is returned to the component part to help power the part.

Figure 2:
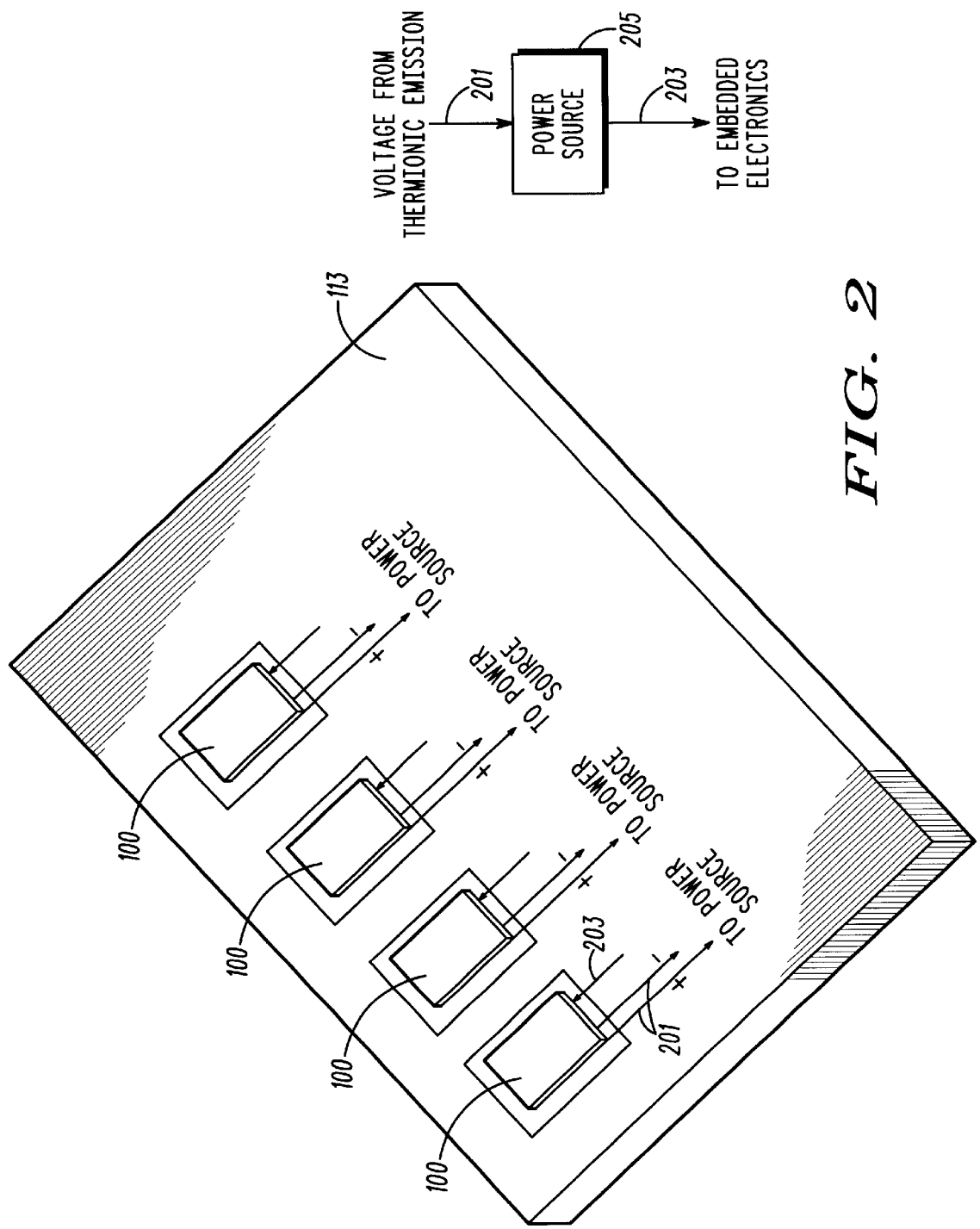
FIG. 2 illustrates multiple heat dissipation devices on a single substrate in accordance with the preferred embodiment of the present invention.

FIG. 2 illustrates multiple heat dissipation devices 100 on a single substrate in accordance with the preferred embodiment of the present invention. As described above, each heat dissipation device 100 comprises thermionic voltage generation means that generates a thermionic voltage. As described above, devices 100 are similar to those described in by Tanaka et al., however unlike Tanaka et al., the emission of electrons into the vacuum is not caused by an applied voltage between anode 109 and cathode 105. In the preferred embodiment of the present invention a voltage is generated between anode 109 and cathode 105 via thermionic emission of electrons from cathode 104, and that voltage is output (via output 201) to a power source 205 that is providing power to embedded electronics 102 (via input 203).

Figure 3:
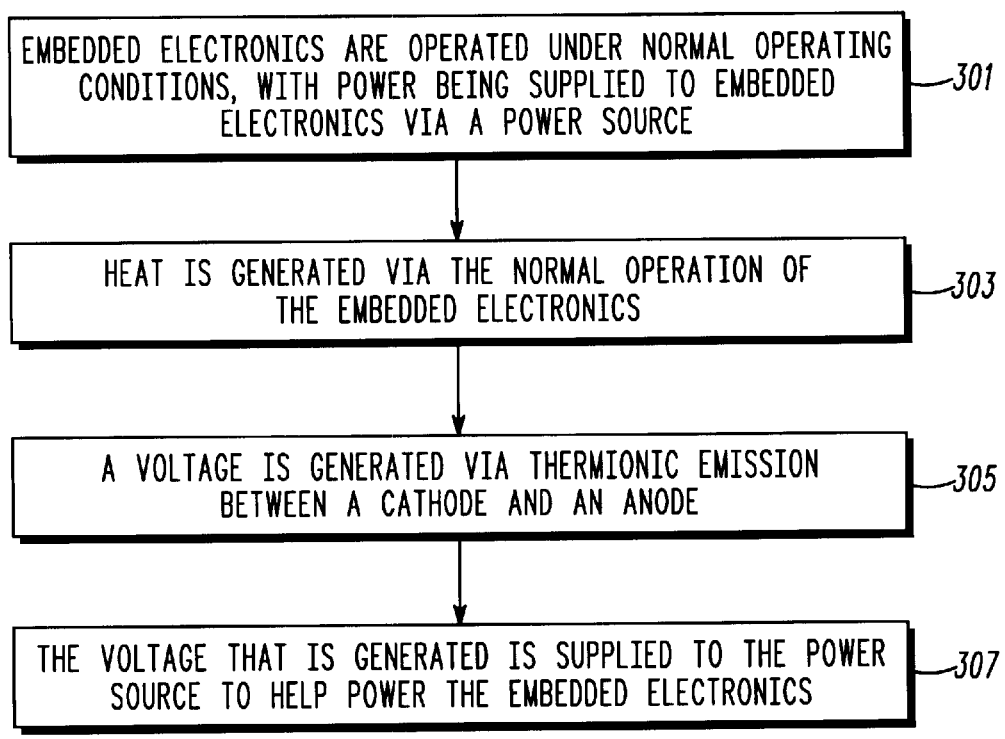
FIG. 3 is a flow chart showing operation of the heat dissipation device in accordance with the preferred embodiment of the present invention.

FIG. 3 is a flow chart showing operation of the heat dissipation device in accordance with the preferred embodiment of the present invention. The logic flow begins at step 301 where embedded electronics 102 are operated under normal operating conditions, with power being supplied to embedded electronics via power source 205. In the preferred embodiment of the present invention power source 205 is a battery supply, however power source 205 may be any power supply such as, but not limited to a dc-to-dc or dc-to-ac converter. Next, at step 303 heat is generated via the normal operation of embedded electronics 102, and at step 305 voltage 117 is generated via thermionic emission between cathode 104 and anode 109. At step 307 the voltage that is generated is supplied to power source 205 to help power embedded electronics 102.

The descriptions of the invention, the specific details, and the drawings mentioned above, are not meant to limit the scope of the present invention. For example, in addition to powering embedded electronics via thermionic emission, the voltage 117 may be utilized to power other electronic components which may, or may not produce a voltage via thermionic emission of electrons (such as cooling fans, capacitors, resistors, modems, Central Processing Units (CPUs), Liquid Crystal Devices (LCDs), Light Emitting Diodes (LEDs), . . . , etc.). It is the intent of the inventors that various modifications can be made to the present invention without varying from the spirit and scope of the invention, and it is intended that all such modifications come within the scope of the following claims and their equivalents.

What is claimed is:

1. A method for dissipating heat from an electronic device, the method comprising the steps of:

operating an electronic device utilizing a power source;

generating heat from the operation of the electronic device;

producing a voltage from the heat generated from the operation of the electronic device; and applying the voltage to the power source to help operate a second electronic device.

2. The method of claim 1 wherein the step of producing the voltage from the heat generated from the operation of the electronic device comprises the step of producing a voltage via a thermionic process from the heat generated from the operation of the electronic device.

3. The method of claim 1 wherein the step of operating the electronic device comprises the step of operating a semiconductor electronic device.

4. The method of claim 1 wherein the step of operating the electronic device comprises the step of operating a Silicon Carbide (SiC) semiconductor device.

5. The method of claim 1 wherein the step of applying the voltage to the power source to help operate the second electronic device comprises the step of applying the voltage to the power source to help operate a second semiconductor device.

* * * * *